United States Patent
Davis

(10) Patent No.: US 9,559,092 B2
(45) Date of Patent: Jan. 31, 2017

(54) ELECTRONIC DEVICE INCLUDING A DIODE

(71) Applicant: Semiconductor Components Industries, LLC, Phoenix, AZ (US)

(72) Inventor: T. Jordan Davis, Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/945,735

(22) Filed: Nov. 19, 2015

(65) Prior Publication Data

US 2016/0079226 A1  Mar. 17, 2016

Related U.S. Application Data

(62) Division of application No. 14/470,239, filed on Aug. 27, 2014, now Pat. No. 9,224,703.

(60) Provisional application No. 61/881,858, filed on Sep. 24, 2013.

(51) Int. Cl.

| | |
|---|---|
| *H01L 27/02* | (2006.01) |
| *H01L 29/167* | (2006.01) |
| *H01L 29/66* | (2006.01) |
| *H01L 23/60* | (2006.01) |
| *H01L 21/762* | (2006.01) |
| *H01L 29/861* | (2006.01) |
| *H01L 29/866* | (2006.01) |

(52) U.S. Cl.
CPC ..... *H01L 27/0255* (2013.01); *H01L 21/76224* (2013.01); *H01L 23/60* (2013.01); *H01L 29/167* (2013.01); *H01L 29/66136* (2013.01); *H01L 29/866* (2013.01); *H01L 29/8611* (2013.01); *H01L 29/861* (2013.01); *H01L 2924/0002* (2013.01)

(58) Field of Classification Search
CPC ........... H01L 27/0255; H01L 21/76224; H01L 23/60; H01L 29/167; H01L 29/66136; H01L 29/8611; H01L 29/866; H01L 29/861; H01L 2920/0002
See application file for complete search history.

(56) References Cited

U.S. PATENT DOCUMENTS

| | | |
|---|---|---|
| 4,475,117 A | 10/1984 | Raabe |
| 7,538,395 B2 | 5/2009 | Keena et al. |
| 7,579,632 B2 | 8/2009 | Salih et al. |
| 2010/0314660 A1 | 12/2010 | Salih et al. |

(Continued)

*Primary Examiner* — Julio J Maldonado
*Assistant Examiner* — Farun Lu
(74) *Attorney, Agent, or Firm* — Abel Law Group, LLP

(57) ABSTRACT

An electronic device can include a substrate, lower and upper semiconductor layers over the substrate, and a doped region at the interface between the lower and upper semiconductor layers. The doped region can have a conductivity type opposite that of a dopant within the lower semiconductor layer. Within the lower semiconductor layer, the dopant can have a dopant concentration profile that has a relatively steeper portion adjacent to the substrate, another relatively steeper portion adjacent to an interface between the first and second semiconductor layers, and a relatively flatter portion between the relative steeper portions. A diode lies at a pn junction where a second dopant concentration profile of the first doped region intersects the relatively flatter portion of the first dopant concentration profile. The electronic device can be formed using different processes described herein.

20 Claims, 9 Drawing Sheets

(56) References Cited

U.S. PATENT DOCUMENTS

2012/0091504 A1\* 4/2012 Davis ................ H01L 27/0255
  257/146
2014/0167101 A1\* 6/2014 Bobde ................ H01L 27/0259
  257/112

\* cited by examiner

ELECTRONIC DEVICE INCLUDING A DIODE

CROSS-REFERENCE TO RELATED APPLICATIONS

This application is a divisional application of and claims priority under 35 U.S.C. §120 to U.S. patent application Ser. No. 14/470,239, entitled "Electronic Device Including a Diode and a Process of Forming the Same", by T. Jordan Davis, filed Aug. 27, 2014, which claims priority under 35 U.S.C. §119(e) to U.S. Provisional Patent Application No. 61/881,858, entitled "Semiconductor Transient Voltage Protection Structure and Method", by T. Jordan Davis, filed Sep. 24, 2013, both of which are assigned to the current assignee hereof and incorporated herein by reference in their entireties.

FIELD OF THE DISCLOSURE

The present disclosure relates to electronic devices and processes of forming electronic devices, and more particularly to, electronic devices including diodes and methods of forming the same.

RELATED ART

In the past, electronics equipment had been susceptible to electrostatic discharge (ESD) from various sources and especially from people that worked in the vicinity of or that touched the equipment. In some cases, ESD protection devices were attached to places of the equipment where such as ESD event may occur. In many applications, the ESD protection devices were attached to signal lines that provided input or an output signals to the electronic equipment. Typically, the application required that the ESD protection device had to have a low capacitance in order to prevent interfering with the signal or prevent forming a large load for devices that maybe driving the signal line Future automotive high speed signal interface applications are requiring that systems operate at higher voltages in the near term of 36 V followed by 48 V. Prior transient voltage suppression designs were found to be insufficient for supporting present, near term, and future voltage requirements. For example, such designs were found to have an unacceptably large variation in breakdown voltage. Accordingly, reduced variation in breakdown voltage is desired.

BRIEF DESCRIPTION OF THE DRAWINGS

Embodiments are illustrated by way of example and are not limited in the accompanying figures.

Figure 1:
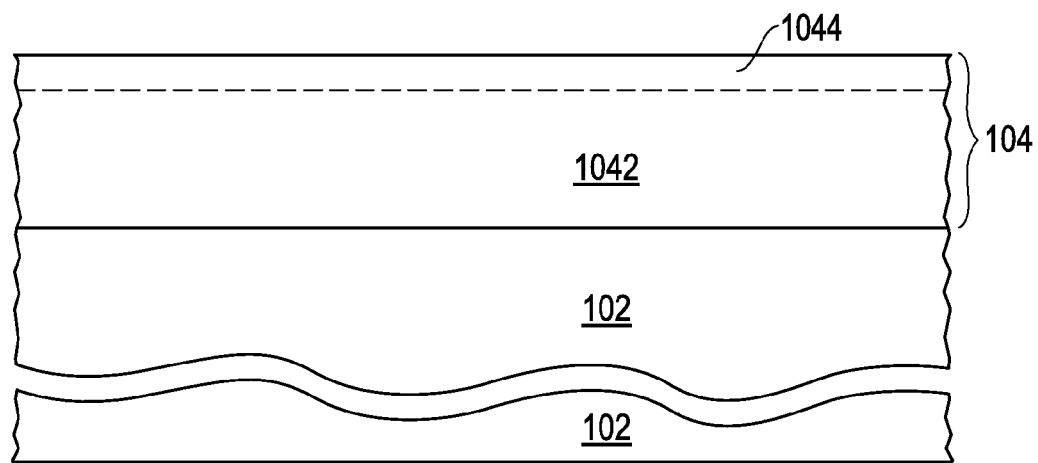
FIG. 1 includes an illustration of a cross-sectional view of a portion of a workpiece including a substrate and a semiconductor layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "designed operating voltage" is intended to mean the nominal voltage over which an electronic device or a portion of the electronic device is designed to operate. For example, a buck converter may be designed to have terminals that are connected to a 12V power supply and ground. Thus, the buck converter has a designed operating voltage of 12 V (12 V-0 V (ground)), even though the actual voltage provided by a 12 V power supply may vary by up to 10% (10.8 V to 13.2 V).

The term "normal operation" and "normal operating state" refer to conditions under which an electronic component or device is designed to operate. The conditions may be obtained from a data sheet or other information regarding voltages, currents, capacitance, resistance, or other electrical parameters. Thus, normal operation does not include operating an electrical component or device well beyond its design limits.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

Electronic devices can include a substrate, lower and upper semiconductor layers over the substrate, and a doped region at the interface between the lower and upper semiconductor layers. The doped region can have a conductivity type opposite that of a dopant within the lower semiconductor layer. Within the lower semiconductor layer, the dopant can have a dopant concentration profile that has a first relatively steeper portion adjacent to the substrate, a second relatively steeper portion adjacent to an interface between the first and second semiconductor layers, and a relatively flatter portion between the first and second relative steeper portions. A diode lies at a pn junction where a second dopant concentration profile of the first doped region intersects the relatively flatter portion of the first dopant concentration profile. The intersection at the relatively flatter portion can allow for less variation of the breakdown voltage for the diode from production run-to-production run, even when each processing step is in the different production runs are performed within the processing specification limits. Hence, an ESD device can be designed with a diode having a lower average breakdown voltage while still exceeding a minimum triggering voltage for the diode.

In a particular embodiment, the doping of the lower semiconductor layer can be controlled during formation of such layer to reduce the likelihood of forming an unintended pn junction within the upper semiconductor layer just above the doped region. Exemplary embodiments and processes of forming the electronic device are described below in more detail.

FIG. 1 includes an illustration of a cross-sectional view of a portion of a workpiece that includes a substrate 102 and a semiconductor layer 104 over the substrate 102. The substrate 102 can include a Group 14 element (i.e., carbon, silicon, germanium, or any combination thereof) and can be heavily n-type or p-type doped. For the purposes of this specification, heavily doped is intended to mean a peak dopant concentration of at least $1 \times 10^{19}$ atoms/cm$^3$, and lightly doped is intended to mean a peak dopant concentration of less than $1 \times 10^{19}$ atoms/cm$^3$. The substrate 102 can be a portion of a heavily doped substrate (e.g., a heavily p-type doped wafer) or may be a buried doped region overlying a base semiconductor material or overlying a buried insulating layer (not illustrated) that lies between a base material, such as sapphire, spinel, or the like, and the semiconductor layer 104. In an embodiment, the substrate 102 is heavily doped with a p-type dopant, such as boron.

The semiconductor layer 104 is formed over the substrate 102. The semiconductor layer 104 can include a Group 14 element (i.e., carbon, silicon, germanium, or any combination thereof). In an embodiment, the semiconductor layer 104 may be formed to include two or more portions. In the embodiment as illustrated in FIG. 1, the semiconductor layer 104 includes a lower portion 1042 that is closer to the substrate 102 and an upper portion 1044 that is further from the substrate 102.

As formed, the lower portion 1042 can include a dopant of the same conductivity type as the substrate 102 and have a dopant concentration less than the substrate 102. The dopant concentration in the lower portion 1042 can be at least $1 \times 10^{15}$ atoms/cm$^3$, at least $1 \times 10^{16}$ atoms/cm$^3$, or at least $1 \times 10^{17}$ atoms/cm$^3$, and in another embodiment, the dopant concentration may be no greater than $1 \times 10^{20}$ atoms/cm$^3$, no greater than $1 \times 10^{19}$ atoms/cm$^3$, or no greater than $1 \times 10^{18}$ atoms/cm$^3$. In a particular embodiment, the dopant concentration is in a range of $1 \times 10^{15}$ atoms/cm$^3$ to $1 \times 10^{20}$ atoms/cm$^3$, or $1 \times 10^{16}$ atoms/cm$^{19}$ to $1 \times 10^{17}$ atoms/cm$^3$.

As formed, the upper portion 1044 may not include any dopant or may include a dopant of the same conductivity type as the substrate 102 and have a dopant concentration less than each of the substrate 102 and the lower portion 1042. When a dopant is present, the dopant concentration in the upper portion 1044 can be at least $1 \times 10^{13}$ atoms/cm$^3$, at least $1 \times 10^{14}$ atoms/cm$^3$, or at least $1 \times 10^{15}$ atoms/cm$^3$, and in another embodiment, the dopant concentration may be no greater than $1 \times 10^{18}$ atoms/cm$^3$, no greater than $1 \times 10^{17}$ atoms/cm$^3$, or no greater than $1 \times 10^{16}$ atoms/cm$^3$. In a particular embodiment, the dopant concentration is in a range of $1 \times 10^{13}$ atoms/cm$^3$ to $1 \times 10^{18}$ atoms/cm$^3$, or $1 \times 10^{14}$ atoms/cm$^3$ to $1 \times 10^{16}$ atoms/cm$^3$.

The substrate 102 can be placed into a reaction chamber, and the semiconductor layer 104 can be formed by epitaxially growing the semiconductor layer 104 from the substrate 102. In another embodiment, the semiconductor layer 104 can be formed by depositing an amorphous semiconductor material and crystalizing the amorphous semiconductor material to form the semiconductor layer 104. When forming the lower portion 1042, a dopant gas can be added to the reaction chamber and flow at a substantially constant rate. When forming the upper portion 1044, the dopant gas can be shut off or may be reduced. Within each of the lower and upper portions 1042 and 1044, such portions can be formed with a relatively constant dopant concentration. In another embodiment, within each of the lower and upper portions 1042 and 1044, the dopant concentration may change slightly as a function of thickness, but the change in concentration may be no greater than an order of magnitude, and may be no greater than a half order of magnitude.

The thickness of the semiconductor layer 104 and the portions 1042 and 1044 can depend on the voltage that is to be supported by the electronic device. In an embodiment, the semiconductor layer 104 can have a thickness of at least 1 micron, at least 1.5 microns, or at least 2 microns, and in another embodiment, the semiconductor layer 104 may have a thickness no greater than 50 microns, no greater than 20 microns, or no greater than 10 microns. In a particular embodiment, the thickness can be in a range of 1 micron to 50 microns or 2 to 20 microns. The thickness of lower portion 1042 can be at least 50%, at least 60% or at least 70% of the thickness of the semiconductor layer 104, and in another embodiment, the thickness of lower portion 1042 may be no greater than 90%, no greater than 88% or no greater than 85% of the thickness of the semiconductor layer 104. The upper portion 1044 can make up the remainder of the thickness of the semiconductor 104.

In an alternative embodiment, one or more additional portions may be used within the semiconductor layer 104. For example, an additional portion of the semiconductor layer 104 may lie between the substrate 102 and the lower portion 1042 of the semiconductor layer 104. Such additional portion can be used to take up some of the dopant that diffuses from the substrate 102 during the formation of the electronic device, and thus, the control of the dopant concentration profile within the lower portion 1042 may be improved. The additional portion may be undoped or have a lower concentration as compared to the lower portion 1042. In another embodiment, the additional portion may be formed undoped or using a dopant gas that initially flows at a lower rate as compared to the lower portion 1042, and the dopant gas flow is increased gradually or in steps until the dopant gas flow for the lower portion 1042 is reached.

Many other alternatives exist for forming the semiconductor layer 102. For example, the upper portion 1042 may have a dopant concentration profile similar to that described with respect to the additional portion. The dopant concentration with the upper portion 1042 can be decreased from the lower portion 1042 gradually or in a step-wise manner as the thickness of the upper portion 1044 is increased. Thus, the embodiments described herein are exemplary and do not limit the scope of the appended claims. The significance of the doping within the semiconductor layer 104 and its resulting improvement in a lower variation in breakdown voltage of a subsequently-formed zener diode will be described in more detail later in this specification.

Figure 2:
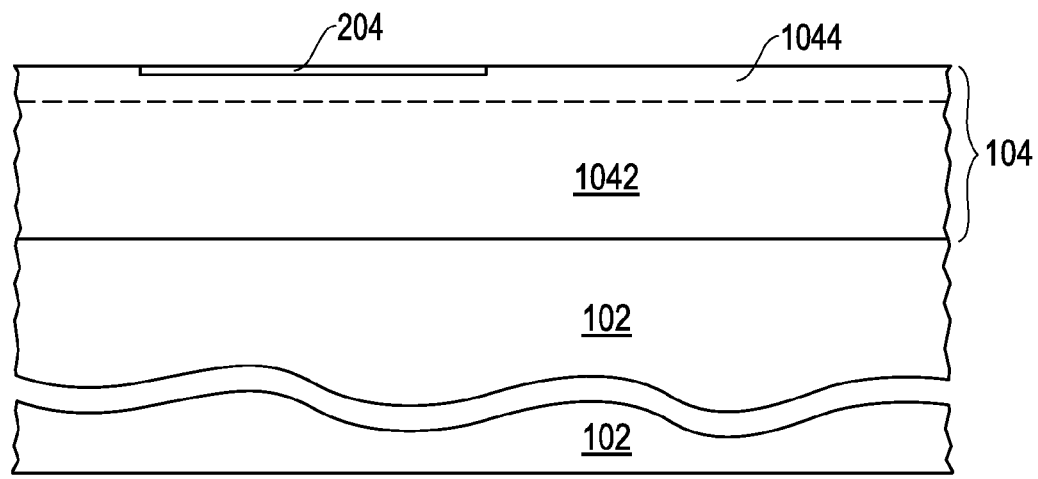
FIG. 2 includes an illustration of a cross-sectional view of the workpiece of FIG. 1 after doping a portion of the semiconductor layer.

FIG. 2 includes a cross-section view of the workpiece after forming a doped region 204. The doped region 204 can be heavily doped with a dopant of the opposite conductivity type as compared to the substrate 102. In an embodiment, the doped region 204 is heavily doped with an n-type dopant, such as phosphorus, arsenic, antimony, or any combination thereof. In a particular embodiment, the doped region 204 includes arsenic or antimony if diffusion of the doped region 204 is to be kept low, and in a particular embodiment, the doped region 204 includes antimony to reduce the level of autodoping (as compared to arsenic) during formation of a subsequently-formed semiconductor layer. In an embodiment, an implant screen layer (not illustrated) can be grown from or deposited over the semiconductor layer 104. The implant screen layer can include an oxide, a nitride, or any oxynitride and have a thickness in a range of 5 nm to 50 nm. A masking layer (not illustrated) is formed over the implant screen layer and patterned to define openings where the doped region 204 is to be formed. The doped region 204 can be formed by implantation. The energy of the implantation is performed so that the peak concentration, as originally formed is within 0.5 micron of the surface of the upper portion 1044. The masking layer and implant screen layer can be subsequently removed. In an embodiment, the peak concentration within the doped region 204 can be at least $1\times10^{19}$ atoms/cm$^3$, at least $2\times10^{19}$ atoms/cm$^3$, or at least $5\times10^{19}$ atoms/cm$^3$, and in another embodiment, the peak concentration may be no greater than $1\times10^{21}$ atoms/cm$^3$, no greater than $5\times10^{20}$ atoms/cm$^3$, or no greater than $1\times10^{10}$ atoms/cm$^3$. In a particular embodiment, the peak concentration within the doped region 204 is in a range of $1\times10^{19}$ atoms/cm$^3$ to $1\times10^{21}$ atoms/cm$^3$, or $1\times10^{19}$ atoms/cm$^3$ to $2\times10^{20}$ atoms/cm$^3$.

Figure 3:
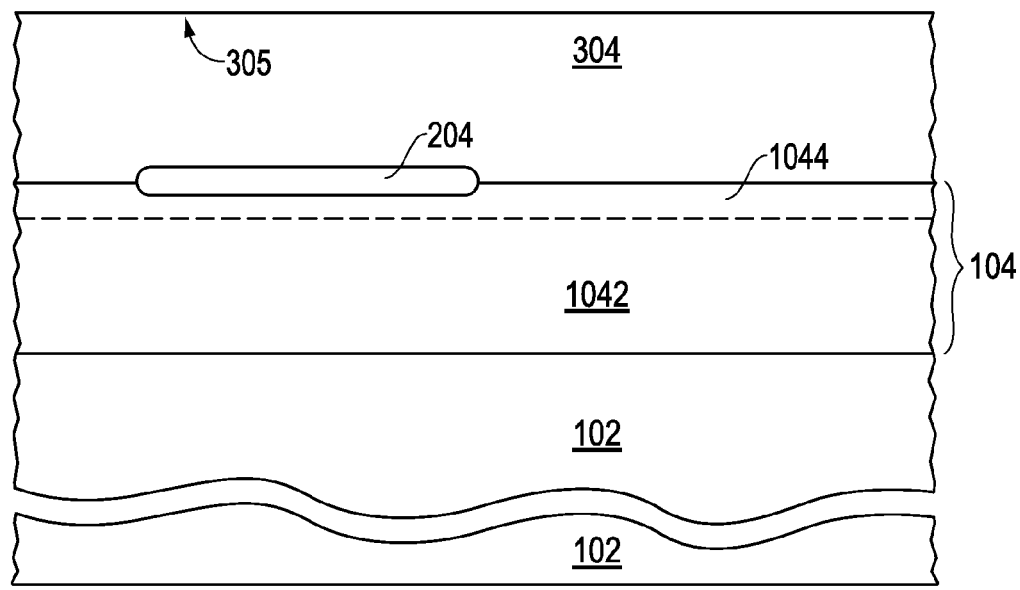
FIG. 3 includes an illustration of a cross-sectional view of the workpiece of FIG. 2 after forming another semiconductor layer.

FIG. 3 includes an illustration of a cross-sectional view after forming a semiconductor layer 304 over the semiconductor layer 104. As formed, the semiconductor layer 304 may not include any dopant or may include a dopant of the same conductivity type or the opposite conductivity type as the substrate 102 and have a dopant concentration less than each of the substrate 102 and the lower portion 1042 of the semiconductor layer 104. When a dopant is present, the dopant concentration in the semiconductor layer 304 can be at least $1\times10^{13}$ atoms/cm$^3$, or at least $1\times10^{14}$ atoms/cm$^3$, at least $1\times10^{15}$ atoms/cm$^3$, and in another embodiment, the dopant concentration may be no greater than $1\times10^{18}$ atoms/cm$^3$, no greater than $1\times10^{17}$ atoms/cm$^3$, or no greater than $1\times10^{16}$ atoms/cm$^3$. In a particular embodiment, the dopant concentration is in a range of $1\times10^{13}$ atoms/cm$^3$ to $1\times10^{18}$ atoms/cm$^3$, or $12\times10^{14}$ atoms/cm$^3$ to $1\times10^{17}$ atoms/cm$^3$. The thickness of the semiconductor layer 304 can depend on the voltage that is to be supported by the electronic device. In an embodiment, the semiconductor layer 304 can have a thickness of at least 1 micron, at least 1.5 microns, or at least 2 microns, and in another embodiment, the semiconductor layer 304 may have a thickness no greater than 50 microns, no greater than 20 microns, or no greater than 10 microns. In a particular embodiment, the thickness can be in a range of 1 micron to 50 microns or 2 to 20 microns. The thickness of semiconductor layer 304 can be less then or greater than the thickness of the semiconductor 104.

The semiconductor layer 304 can be formed by epitaxially growing it from the semiconductor layer 104. In another embodiment, the semiconductor layer 304 can be formed by depositing an amorphous semiconductor material and crystalizing the amorphous semiconductor material to form the semiconductor layer 304. During the formation of the semiconductor layers 104 and 304, dopant from the substrate 102 can diffuse into the semiconductor layer 104 or both semiconductor layers 104 and 304, and dopant from the lower portion 1042 of the semiconductor layer 104 can diffuse into the upper portion 1044 or both the upper portion 1044 and the semiconductor layer 304. Dopant from the doped region 204 can diffuse into the semiconductor layer 304, so that the doped region 204 extends from the interface between the semiconductor layer 104 and 304 towards the substrate 102 and a primary surface 305 of the semiconductor layer 304.

Figure 4:
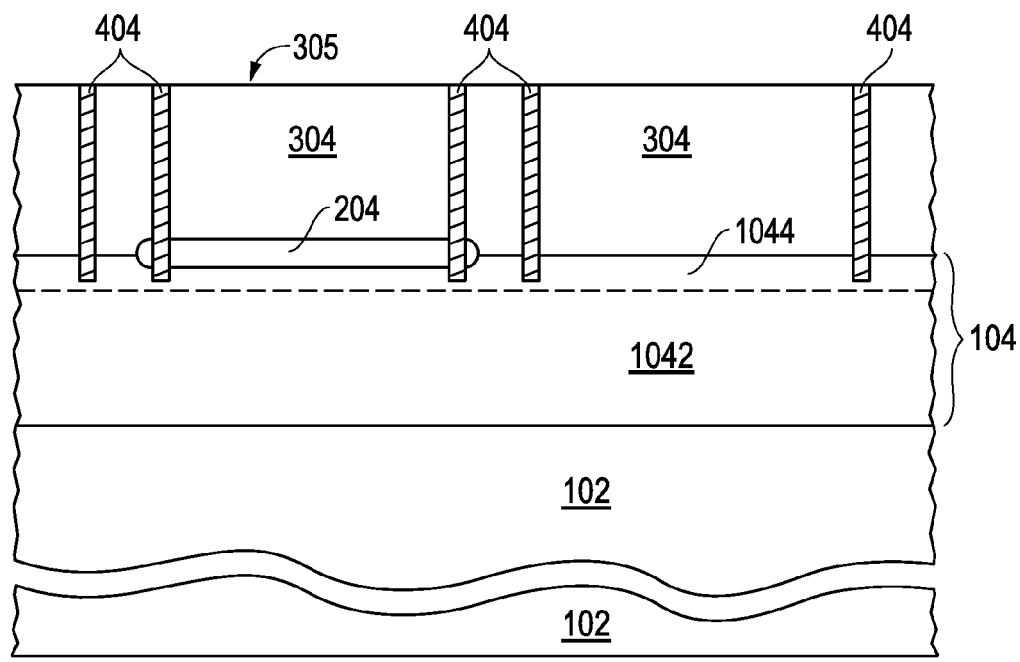
FIG. 4 includes an illustration of a cross-sectional view of the workpiece of FIG. 3 after forming isolation pillars.

FIG. 4 includes an illustration of a cross-sectional view after forming isolation pillars 404. The isolation pillars 404 can be formed by using a masking layer and etching portions of the workpiece from the primary surface 305 of the semiconductor layer 304 towards the substrate 102. In the embodiment as illustrated in FIG. 4, the bottoms of the trenches can lie within the upper portion of the 1044 of the semiconductor layer 104. In another embodiment, the bottoms of the trenches can lie within the lower portion 1042 of the semiconductor layer 104, or the substrate 102. In an embodiment, the trenches can have a width of at least 20 nm, at least 50 nm, or at least 100 nm, and in another embodiment the trenches may have a width no greater than 5000 nm, no greater than 2000 nm, or no greater than 1000 nm. In a particular embodiment, the widths of the trenches can be in a range of 20 nm to 5000 nm or 50 nm to 2000 nm.

The exposed surfaces within the trenches can be thermalized oxidized and filled with a trench-fill material. In an embodiment, the oxide from the thermal oxidation can have a thickness of at least 5 nm, at least 10 nm, or at least 20 nm, and in another embodiment, the thickness may be no greater than 1000 nm, no greater than 500 nm, or no greater than 200 nm. In a particular embodiment, the thickness is in a range of 5 nm to 1000 nm or 10 nm to 200 nm. The trench-fill material can fill the remainder of the trench and also be deposited over the thermal oxide that lies along the primary surface 305 of the semiconductor layer 304. The trench-fill material may include a material having a thermal coefficient of expansion closer to or greater than the material of the semiconductor layer 304, as compared to the thermal oxide. In a particular embodiment, the trench-fill material can include amorphous or polycrystalline silicon and may be doped or undoped, or can include tungsten. A polishing or etch operation can be performed to remove the trench-fill material overlying the primary surface 305 of the semiconductor layer. The thermal oxide overlying the primary surface 305 may also be removed.

In another embodiment, the isolation pillars 404 can include only one or more insulating materials. For example, the isolation pillars 404 can include a conformally deposited insulating material or may include a thermal oxide that completely fills the trench. In a further embodiment, the isolation pillars 404 can include a combination of the thermal and deposited insulating materials.

Figure 5:
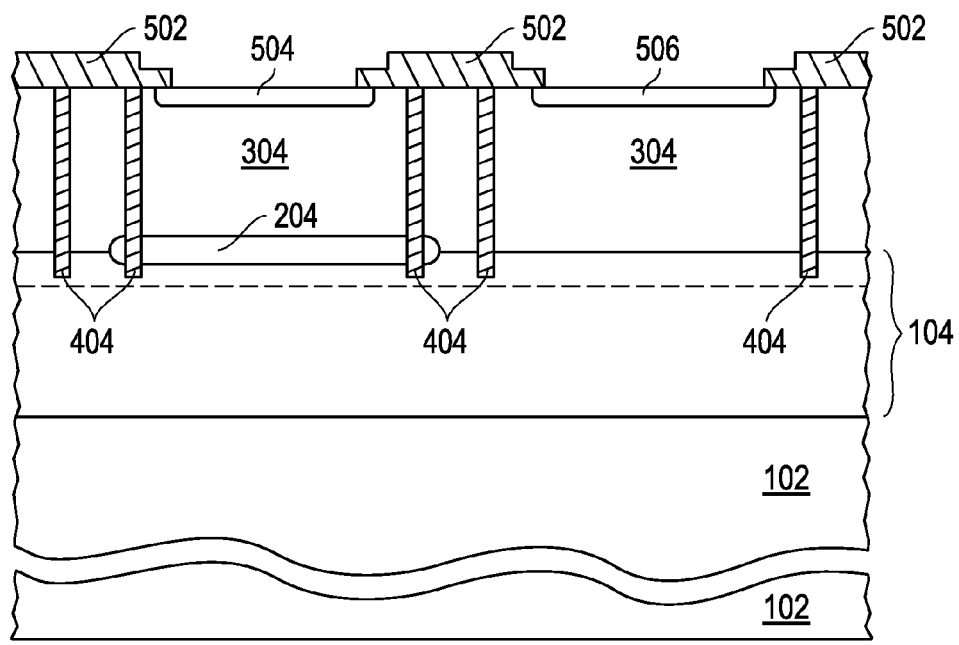
FIG. 5 includes an illustration of a cross-sectional view of the workpiece of FIG. 4 after forming a patterned insulating layer over and doped regions within the other semiconductor layer.

FIG. 5 includes an illustration of a cross-sectional view after forming a patterned insulating layer 502 and doped regions 504 and 506. An insulating layer can be formed over the semiconductor layer 304 and the isolation pillars 404 and patterned to define openings where doped regions 504 and 506 are to be formed. The patterned insulating layer 502 can include a single film or a plurality of films. The single film or each film within the patterned insulating layer 502 can include an oxide, a nitride, or an oxynitride. In an embodiment, the thickness of the patterned insulating layer 502 can be at least 0.1 micron, at least 0.2 microns, or at least 0.3 microns, and in another embodiment, the thickness of the patterned insulating layer 502 may be no greater than 5 microns, no greater than 3 microns, or no greater than 2 microns. The profile of the openings may be stepped (as illustrated in FIG. 5), not stepped (transitions at the opening from the full thickness to the semiconductor layer 304 with a vertical or near vertical wall), have a curved profile (as produced using a reflow process), or the like. If needed or desired, an implant screen layer (not illustrated) may be formed after defining the openings and before forming the doped regions 504 and 506. The implant screen layer can have any of the compositions and thicknesses as previously described.

The doped regions 504 and 506 can be sequentially formed. For example, a masking layer (not illustrated) can be formed over the portion of the semiconductor layer 304 where the doped region 506 is to be formed, and dopant for the doped region 504 can be introduced into the semiconductor layer 304. The masking layer can be removed, and another masking layer (not illustrated) can be formed over the doped region 504, and dopant for the doped region 506 can be introduced into the semiconductor layer 304. The order of formation of the doped regions 504 and 506 can be reversed if needed or desired.

The doped region 504 can be heavily doped and have a conductivity type that is the same as the substrate 102 and opposite the doped region 204. The doped region 506 can be heavily doped and have a conductivity type that is the opposite as the substrate 102. Each of the doped regions 504 and 506 can be formed by implantation. The energy of the implantation is performed so that the peak concentration, as originally formed is within 0.5 micron of the primary surface of the semiconductor layer 304. In an embodiment, the peak concentration within the doped regions 504 and 506 can be at least $1\times10^{19}$ atoms/cm$^3$, at least $2\times10^{19}$ atoms/cm$^3$, or at least $5\times10^{19}$ atoms/cm$^3$, and in another embodiment, the peak concentration may be no greater than $1\times10^{21}$ atoms/cm$^3$, no greater than $5\times10^{20}$ atoms/cm$^3$, or no greater than $1\times10^{10}$ atoms/cm$^3$. In a particular embodiment, the peak concentration within the doped regions 504 and 506 is in a range of $1\times10^{19}$ atoms/cm$^3$ to $1\times10^{21}$ atoms/cm$^3$, or $1\times10^{19}$ atoms/cm$^3$ to $2\times10^{20}$ atoms/cm$^3$.

In an embodiment, the doped region 504 overlies the doped region 204, and the doped region 506 does not overlie any part of the doped region 204. In another embodiment, the doped region 506 may overlie is least part of the doped region 204 or a different doped region (of the same or different conductivity type as the doped region 204) having a peak dopant concentration at about the same elevation as the doped region 204.

Figure 6:
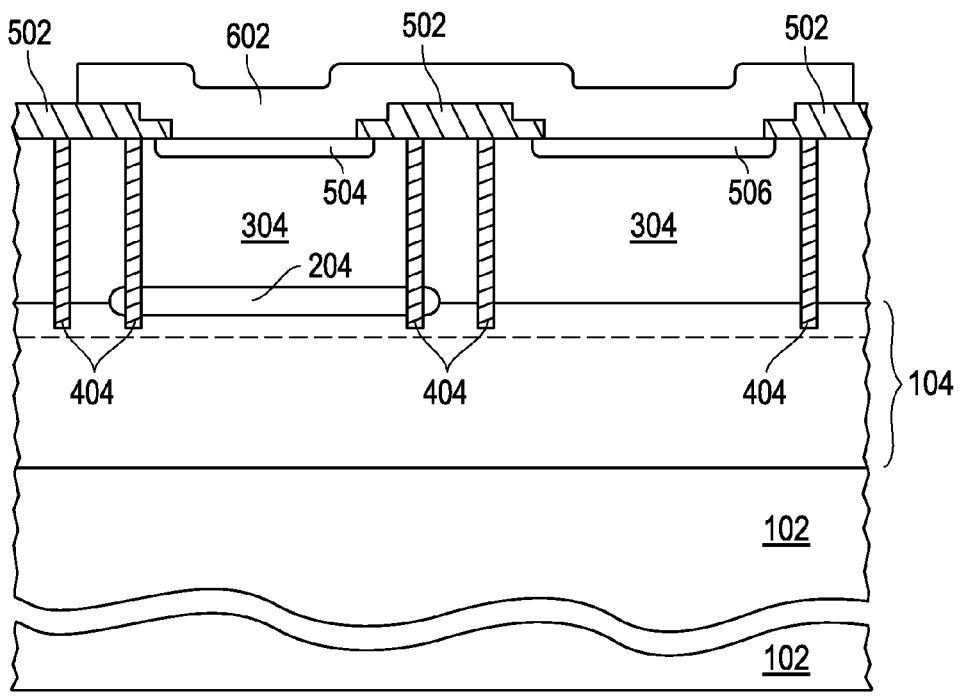
FIG. 6 includes an illustration of a cross-sectional view of the workpiece of FIG. 5 after forming a substantially completed device.

FIG. 6 includes an illustration of a cross-sectional view of a substantially completed electronic device. An interconnect 602 can form contacts to the doped regions 504 and 506. The interconnect 602 can include aluminum, copper, a refractory metal, a noble metal, another suitable conductive material, or any combination thereof. In an embodiment, the thickness of the interconnect can be at least 0.1 micron, at least 0.2 micron, or at least 0.3 micron, and in another embodiment, the thickness may be no greater than 5 microns, no greater than 3 microns, or no greater than 2 microns. In another embodiment (not illustrated), conductive plugs can be formed between the interconnect 602 and each of the doped regions 504 and 506.

The electronic device can include components (not illustrated) that are to be protected by ESD devices. Accordingly, many operations may be performed in making the electronic device that can affect the dopant concentration profiles. In an embodiment, thermal oxidation can be performed in forming shallow trench isolation or a gate dielectric layer, and annealing or driving other implants, and other thermal operations may be performed that affect the dopant concentration profiles.

During formation of the electronic device, dopant from the substrate 204, semiconductor layer 104, and doped regions 204, 504, and 506 can diffuse. For example, dopant from the substrate 102, semiconductor layer 104, or both may diffuse into the semiconductor layer 304. A diode lies at a pn junction between the substrate 102 and the doped region 204. In an embodiment, the pn junction can be within the semiconductor layer 104, and in a more particular embodiment, within the lower portion 1042 of the semiconductor layer 104. Another diode lies at a pn junction between the doped region 204, and the doped region 504. In an embodiment, the pn junction can be within the semiconductor layer 304. A further diode lies at a pn junction between the substrate 102 and the doped region 506. In an embodiment, the pn junction can be within the semiconductor layer 304, and in another embodiment, within the semiconductor layer 104.

Figure 7:
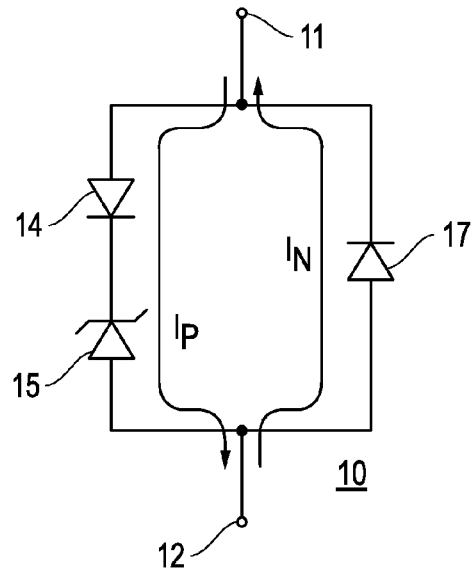
FIG. 7 includes a schematic diagram of a circuit for an ESD device.

A better understanding of the implementation in a circuit and corresponding physical structures are described below in conjunction with FIGS. 7 to 12. FIG. 7 schematically illustrates an embodiment of a portion of an ESD protection device or ESD device 10 that has a low capacitance and a fast response time. FIG. 7 includes a single channel ESD device 10. The ESD device 10 includes two terminals. A terminal 11 typically is an input terminal, and a terminal 12 generally is an output terminal that is connected to another element (not shown) that is to be protected by the ESD device 10. For example, the terminal 11 may be connected to the high side of a regulated power supply (such as a 5V supply). The ESD device 10 can be configured to have a low capacitance between the terminals 11 and 12. The ESD device 10 may be designed to limit the maximum voltage that is formed between the terminals 11 and 12 to the clamp voltage of the ESD device 10. A sharp breakdown voltage characteristic (or sharp knee) of the ESD device 10 can assist in controlling more accurately the value of the clamp voltage. The low capacitance assists in providing the ESD device 10 with a fast response time. The ESD device 10 includes a steering diode 14 that is formed as a P-N junction diode, a zener diode 15 that is connected in series with diode 14, and a steering diode 17 that is formed as a P-N junction diode. The diode 17 is coupled in parallel with the series combination of the diodes 14 and 15.

In normal operation, the ESD device 10 is biased to a normal operating voltage, such as a voltage that is between about 1 V and the breakdown voltage of the diode 15, by applying about 1 V to terminal 11 and a ground reference voltage to the terminal 12. Because of the characteristics of the ESD device 10, the capacitance of the ESD device 10 can remain low as the voltage between the terminals 11 and 12 varies over this normal operating voltage. At a zero biased condition, the ESD device 10 has very low capacitance values for the diodes 14 and 15. Since the capacitance of capacitors in series is smaller than that of the smallest capacitor, the capacitance resulting from the diodes 14 and 15 at the zero bias condition is smaller than the capacitance of either of the diodes 14 or 15. The capacitance of the ESD device 10 is the sum of the equivalent capacitance of the diodes 14 and 15 plus the capacitance of the diode 17. The capacitance of the diode 17 is also very small, thus, the overall capacitance of the ESD device 10 is very small at this zero bias condition.

If a positive ESD event is received on the terminal 11, the terminal 11 is forced to a large positive voltage relative to the terminal 12. Because the anode of the diode 14 is connected to the terminal 11 and the cathode is connected to the cathode of the diode 15, the large positive voltage forward biases the diode 14 and reverse biases the diode 15. As the voltage between the terminals 11 and 12 reaches the positive threshold voltage of the ESD device 10 (the forward voltage of the diode 14 plus the breakdown voltage of the diode 15) a positive current ($I_P$) flows from the terminal 11 through the diodes 14 and 15 to the terminal 12. The diode 15 clamps the maximum voltage applied to the terminal 12 to approximately the breakdown voltage of the diode 15 (plus the forward voltage of the diode 14). The sharp knee of the diode 15 causes the diode 15 to rapidly clamp the maximum voltage between the terminals 11 and 12 to the breakdown voltage of the diode 15. The breakdown voltage of the diode 15 can be 2.5 V to 200 V, and in a particular embodiment, can be in a range of 10 V to 35 V. If a negative ESD event is received on the terminal 11, the terminal 11 is forced to a large negative voltage relative to the terminal 12. Because the anode of the diode 17 is connected to the terminal 12 and the cathode is connected to the terminal 11, the large negative voltage forward biases the diode 17 and a negative current ($I_N$) flows from the terminal 12 through the diode 17 to the terminal 11. After the diode 17 is forward biased, it will safely handle the negative ESD pulse, allowing the ESD device 10 to provide bidirectional ESD protection.

Figure 8:
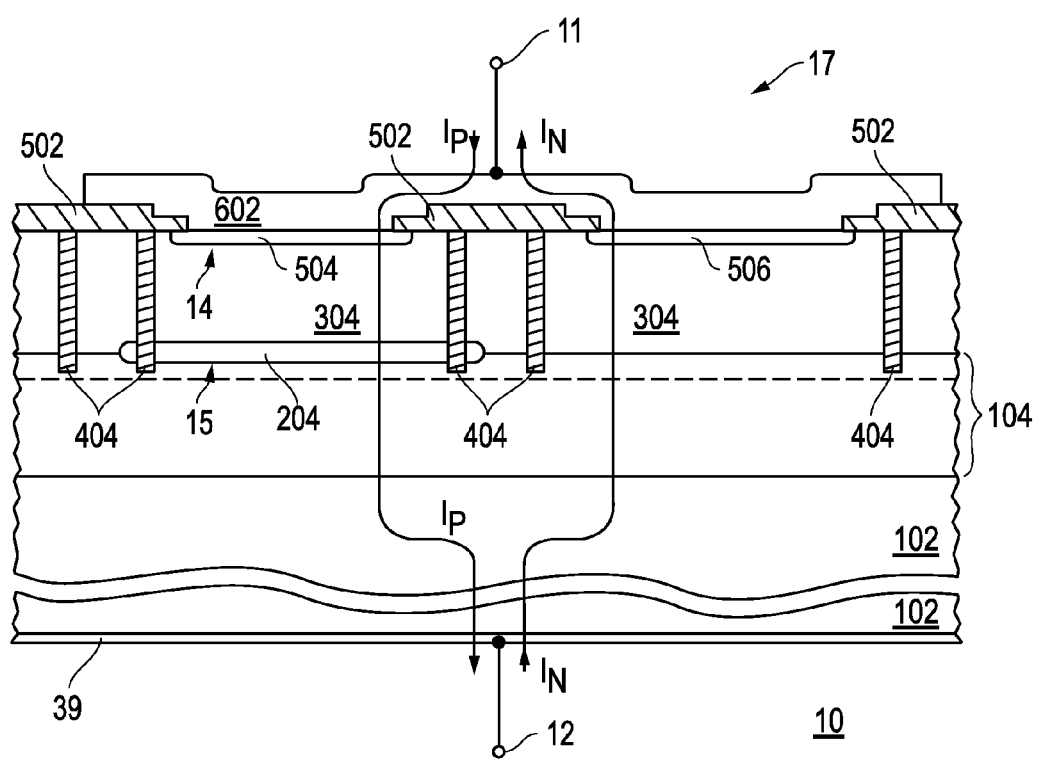
FIG. 8 includes an illustration of a cross-sectional view of the workpiece of FIG. 6 and a mapping to identify circuit components and current flows with respect to FIG. 7.

FIG. 8 illustrates a cross-sectional view of a portion of an embodiment of the ESD device 10 and how is can be seen in a particular physical structure. FIG. 8 has the electronic components and current lines mapped onto the physical structure of FIG. 6. The structure further comprises a terminal 39 on the backside of and electrically connected to the substrate 102. The diodes 14, 15, and 17 are identified in a general manner by arrows and correspond to the junctions as previously described with respect to FIG. 6. The isolation pillars 404 help to direct the current in the proper direction.

Figure 9:
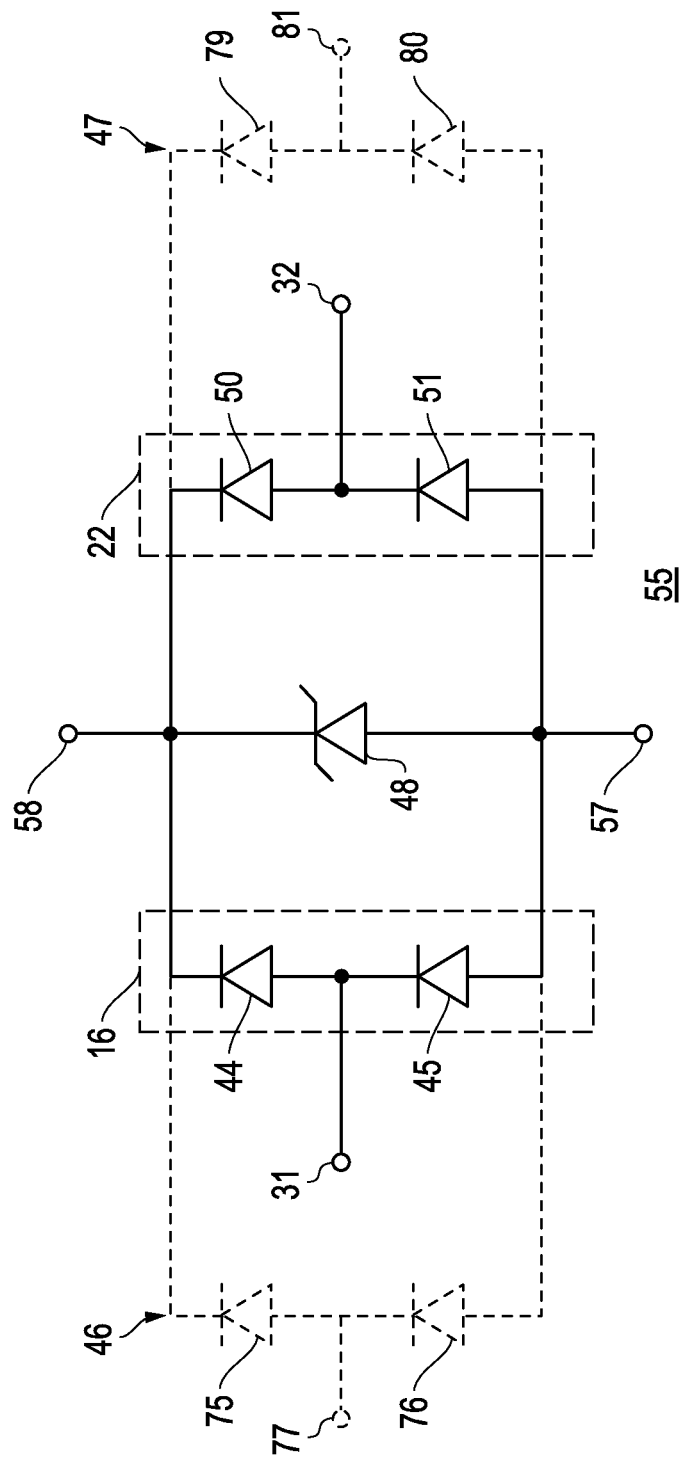
FIG. 9 includes a schematic diagram of a circuit for an ESD device having a shared zener diode.

FIG. 9 schematically illustrates an embodiment of a portion of an ESD device 55 with a multichannel configuration with a shared zener diode. The ESD device 55 includes two terminals, a terminal 31 and a terminal 32, and is configured to provide bidirectional ESD protection between terminals 31 and 32. The ESD device 55 further comprises two power supply terminals. A terminal 58 usually is connected to the voltage rail of a power supply, and a terminal 57 is connected to the common reference potential. The terminals 31 and 32 provide ESD protection for signals that are passed through the terminals 31 and 32. Either of the terminals 31 and 32 can be an input terminal or an output terminal. The output terminal usually is connected to another element (not shown) that is to be protected by the ESD device 55. For example, the terminal 32 may be used as the output terminal and connected to the high side of a regulated power supply (such as a 5V supply). The ESD device 55 can be configured to have a low capacitance between the terminals 31 and 32. The ESD device 55 can be designed to limit the maximum voltage that is formed between the terminals 31 and 32 to the clamp voltage of the ESD device 55. Furthermore, the ESD device 55 can have a sharp knee or sharp breakdown voltage characteristic that assists in controlling more accurately the value of the clamp voltage. The low capacitance assists in providing the ESD device 55 with a fast response time. In the embodiment as illustrated, the ESD device 55 includes a plurality of steering diode channels that includes a steering diode channel 16 and a steering diode channel 22. The channel 16 includes a steering diode 44 that has an anode commonly connected to the terminal 31 and to a cathode of a steering diode 45. The channel 22 includes a steering diode 50 that has an anode commonly connected to the terminal 32 and to a cathode of a steering diode 51. The diodes 44, 45, 50, and 51 are formed as P-N junction diodes that have a low capacitance. A zener diode 48 is connected in parallel with each of the channels 16 and 22. The diode 48 has an anode connected to the anode of the diodes 45 and 51, and a cathode connected to the cathode of the diodes 44 and 50.

In normal operation, ESD device 55 can be biased to a normal operating voltage, such as a voltage that is between about 1 V and the breakdown voltage of diode 48, such as by applying about 1 V to the terminal 31 and a ground reference voltage to the terminal 32. The capacitance of ESD device 55 can remain low as the voltage between the terminals 31 and 32 varies over this normal operating voltage. At a zero bias condition, the ESD device 55 can have very low capacitance values for the diodes 44, 45, 50, and 51. Since there are two parallel paths between the terminals 31 and 32, the capacitance value of each path is the sum of the capacitances in each path. The first path includes the capacitances of the diodes 44, 48 and 51 in series. Since the capacitance of capacitors in series is smaller than that of the smallest capacitor, then the capacitance of the first path is smaller than the capacitance of either of the diodes 44, 48, or 51. Similarly, the capacitance of the second path, that includes the diodes 50, 48 and 45, is also very small. The overall additive value of the two paths forms a small zero bias capacitance for the ESD device 55.

If a positive ESD event is received on the terminal 31, the terminal 31 is forced to a large positive voltage relative to the terminal 32. The large positive voltage forward biases the diodes 44 and 51 and reverse the biases the diode 48 in addition to the diodes 45 and 50. As the voltage between the terminals 31 and 32 reaches the positive threshold voltage of the ESD device 55 (the forward voltage of the diodes 44 and 51 plus the breakdown voltage of the diode 48) a positive current ($I_P$) flows from the terminal 31 through the diode 44 to the diode 48, and through the diodes 48 and 51 to the terminal 32. The breakdown voltage of the diode 48 clamps the maximum voltage formed between the terminals 31 and 32 to approximately the breakdown voltage of the diode 48 (plus the forward voltage of the diodes 44 and 51). If a negative ESD event is received on the terminal 31, the terminal 31 is forced to a large negative voltage relative to the terminal 32. The large negative voltage forward biases the diodes 50 and 45, and reverse biases the diode 48 in addition to the diodes 44 and 51. As the voltage between the terminals 31 and 32 reaches the negative threshold voltage of the ESD device 55 (the forward voltage of the diodes 50 and 45 plus the breakdown voltage of the diode 48) a negative current ($I_N$) flows from the terminal 32 through the diode 50 to the diode 48, and through the diodes 48 and 45 to the terminal 31. The sharp knee of the diode 48 causes the diode 48 to rapidly clamp the maximum voltage between the terminals 31 and 32 to the breakdown voltage of the diode 48 (plus the forward voltage of the diodes 45 and 50).

In the embodiment as illustrated in FIG. 9, the ESD device 55 includes additional channels, such as another channel 46 in parallel with the channel 16 and another channel 47 in parallel with the channel 22. The channel 46 includes series connected P-N diodes 75 and 76 that have a terminal 77 connected to a common node of the diodes 75 and 76. Also, the channel 47 includes series connected P-N diodes 79 and 80 that have a terminal 81 connected to a common node of the diodes 79 and 80.

Figure 10:
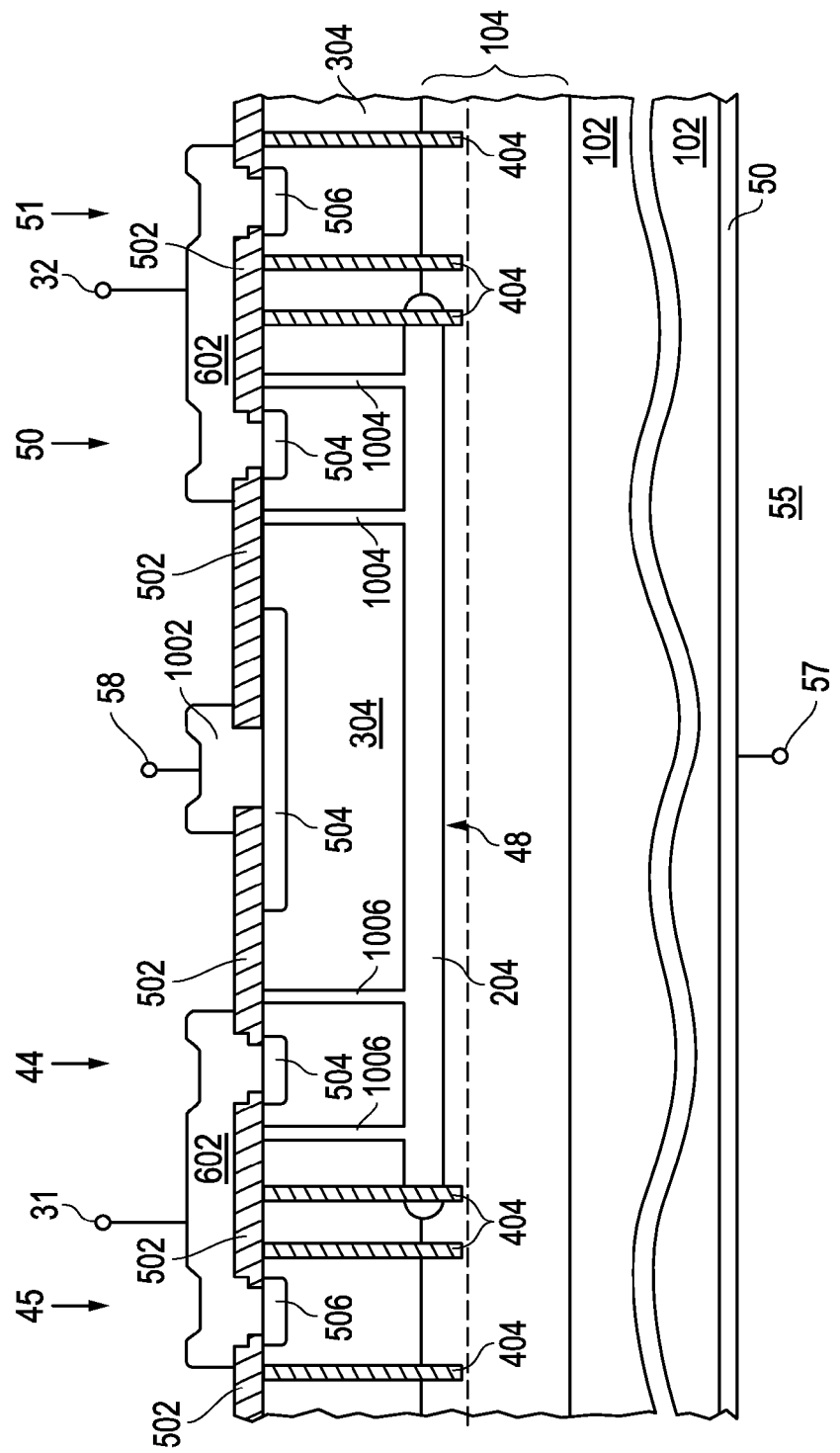
FIG. 10 includes an illustration of a cross-sectional view of an electronic device in accordance with an alternative embodiment and a mapping to identify circuit components and current flows with respect to FIG. 9.

FIG. 10 illustrates a cross-sectional portion of the ESD device 55 and its mapping to a physical structure. The diodes 44 and 50 may have substantially equal capacitance values. In some cases, a mild inversion layer may form near the surface of the semiconductor layer 304 between the center and right doped regions 504 and between center and left doped regions 504. Such an inversion layer could affect the capacitance of the diodes 44 and 50. The conductive regions 1004 and 1006 can assist in reducing disturbances in the capacitance values of the diodes 44 and 50 so that the values are more equally matched. The conductive regions 1004 and 1006 may be viewed as blocking structures that reduce electrical coupling between the enclosed portions and other portions of ESD device 55. Conductive regions 1004 and 1006 extend through the semiconductor layer 304 to the doped region 204. The conductive regions 1004 and 1006 can include a conductive material, such as a heavily doped semiconductor material, within trenches or may be formed by implanting the regions using one or more implantations.

The periphery of the conductive regions 1004 generally forms a closed polygon that encloses a portion of the semiconductor layer 304. The doped region 504 is positioned within the portion of the semiconductor layer 304 that is enclosed by conductive regions 1004. The conductive regions 1004 can be 2 microns to 20 microns away from the right doped region 504 in order to help to prevent increasing the capacitance of the right doped region 504, thus of the diode 50. The periphery of the conductive regions 1006 forms a closed polygon that encloses another portion of the semiconductor layer 304. The left doped region 504 is positioned within the portion of the semiconductor layer 304 that is enclosed by the conductive regions 1006. The conductive regions 1006 can be 2 microns to 20 microns away from the left doped region 504 in order to prevent increasing the capacitance of the left doped region 504, thus of the diode 44. Each of the conductive regions 1004 and 1006 may be considered a separate multiply-connected domain.

Although the P-N diodes 75, 76, 79, and 80 are not illustrated in FIG. 5, those skilled in the art will appreciate that the diodes 75 and 79 should be formed as doped regions overlying the doped region 204 similar to respective the diodes 44 and 50 and corresponding the corresponding doped regions 504. The doped regions of the diodes 75 and 79 generally would be enclosed by the isolation pillars 404. In order to form diodes the 75 and 79, the doped region 204 may be made larger, such as extended in a direction that would be perpendicular to the page shown in FIG. 10. Alternately, another region similar to the doped region 204 may be formed extending from the interface between the semiconductor layers 104 and 304 and electrically connected to the doped region 204 illustrated in FIG. 10. Thus, the doped region 204 or the additional region that is similar to the doped region 204 would electrically connect the cathodes of the diodes 75 and 79 to the cathode of the diode 48. The diodes 76 and 80 would be formed in semiconductor layer 304 and not overlying the doped region 204. Each of the doped regions used for diodes 76 and 80 may be within a closed polygon that is formed by isolation pillars similar to the isolation pillars 404. Thus, the anode of the diodes 76 and 80 would be connected to the anode of the diode 48 by the semiconductor layer 104, the substrate 102 or both.

Figure 11:
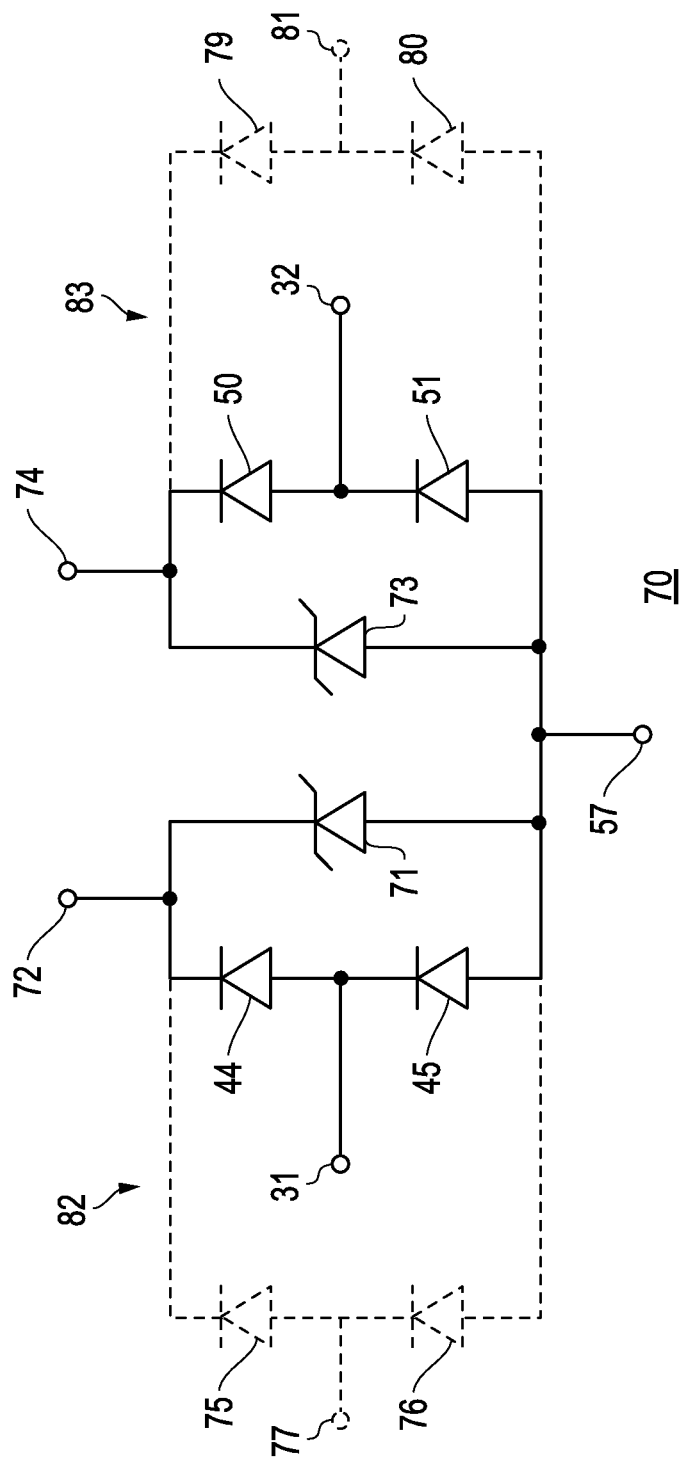
FIG. 11 includes a schematic diagram of a circuit for an ESD device having separate zener diodes.

FIG. 11 schematically illustrates an embodiment of a portion of an ESD device 70 that includes two ESD devices with each ESD device optionally having multiple channels. An ESD device 82 includes a zener diode 71 connected in parallel with P-N diodes 44, 45, and optionally diodes 75, and 76. The ESD device 82 has input/output terminals 31 and 77 and also includes a terminal 72 that provides a connection to the cathode of the diode 71. Another ESD device 83 includes a zener diode 73 connected in parallel with P-N diodes 50, 51, and optionally diodes 79, and 80. The ESD device 83 has input/output terminals 32 and 81 and also includes a terminal 74 that provides a connection to the cathode of the diode 73. The ESD devices 82 and 83 have a common connection to the terminal 17 at the anode of the diodes 71, 73, 45 and 51. The terminals 72 and 74 may be left floating, connected to each other, or connected to separate inputs to meet the requirements of different applications.

Figure 12:
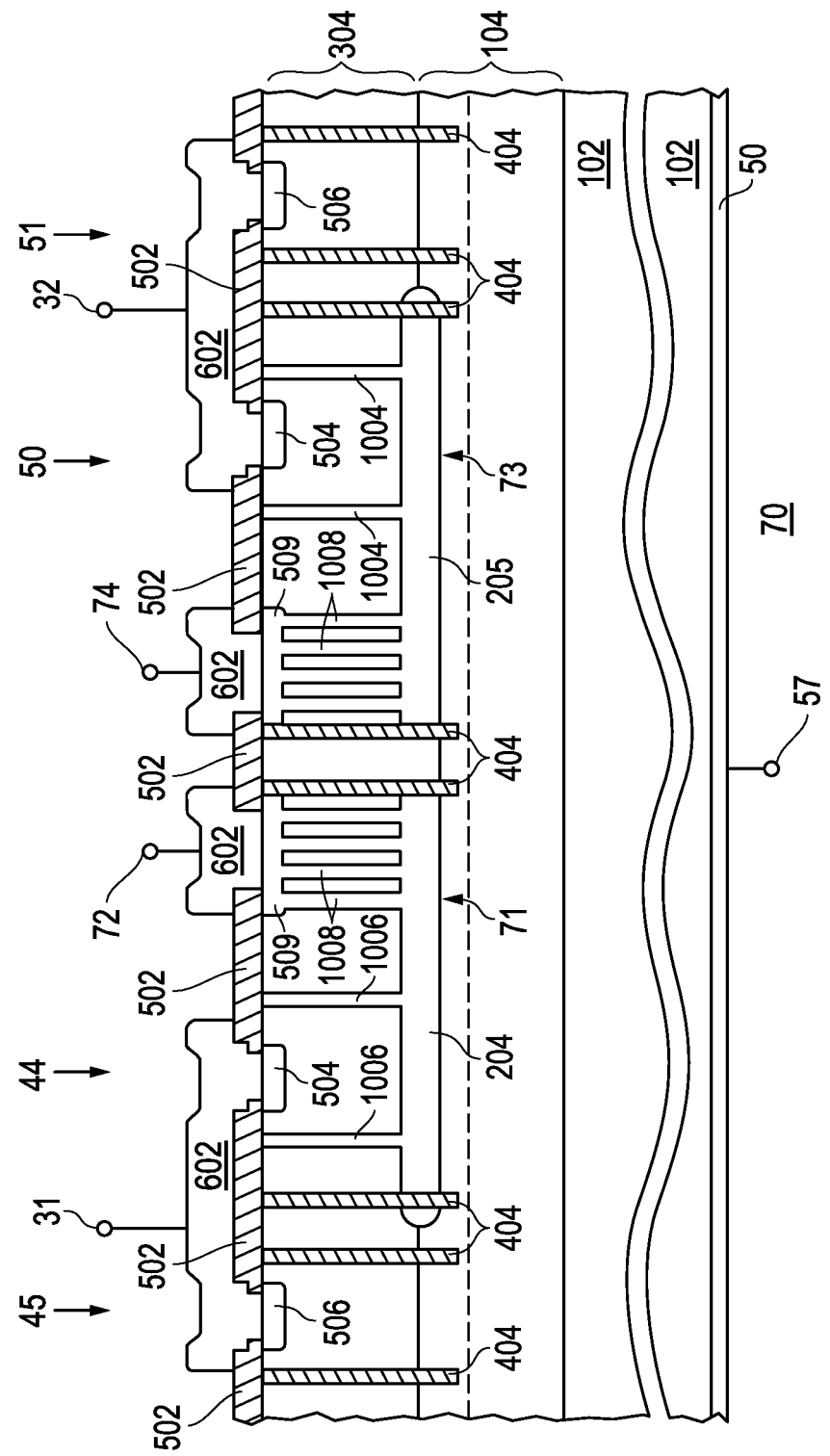
FIG. 12 includes an illustration of a cross-sectional view of an electronic device in accordance with an alternative embodiment and a mapping to identify circuit components and current flows with respect to FIG. 11.

FIG. 12 illustrates a cross-sectional portion of an embodiment of the ESD device 70 that was described in the description of FIG. 11. The cross-section of device 70 is similar to the cross-section of the ESD device 55. The ESD device 70 includes a doped region 205 that is similar to the doped region 204. The doped region 204 is coupled to the terminal 72 via a doped region 509 and conductive regions 1008, and the doped region 205 is coupled to the terminal 74 via another doped region 509 and another set of conductive regions 1008. The doped regions 509 can have the same conductivity type as the doped regions 504, and in a particular embodiment, the doped regions 509 can be formed at substantially the same time as the doped regions 504. The conductive regions 1008 can be formed using any of the materials and techniques as previously described with respect to the conductive regions 1004 and 1006.

After reading this specification, skilled artisans will appreciate that the terminals 72 and 74 are not required, and thus, the conductors 85 and 86 may be omitted from ESD device 70.

Although the doping concentrations given for the doped regions 204 and 205 are well suited for a 5 V breakdown voltage for the diodes 48, 71, and 73, skilled artisans will appreciate that the doping concentrations may change for other breakdown voltages. For example, for an 200 V breakdown voltage, the doping concentration of the doped regions 204 and 205 may be decreased, or the doping concentration of substrate 102 may be decreased, or the doped regions 204 and 205 along with substrate 102 may be decreased.

Figure 13:
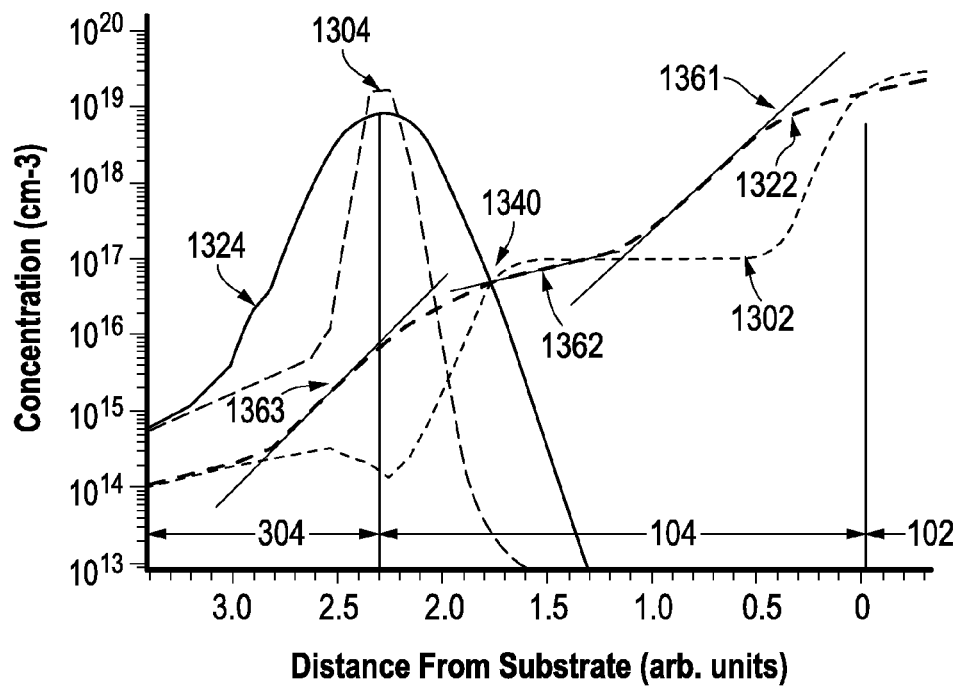
FIG. 13 includes a plot of doping concentration profiles at different times in the process flow for an electronic device made in accordance with a particular embodiment.
Figure 14:
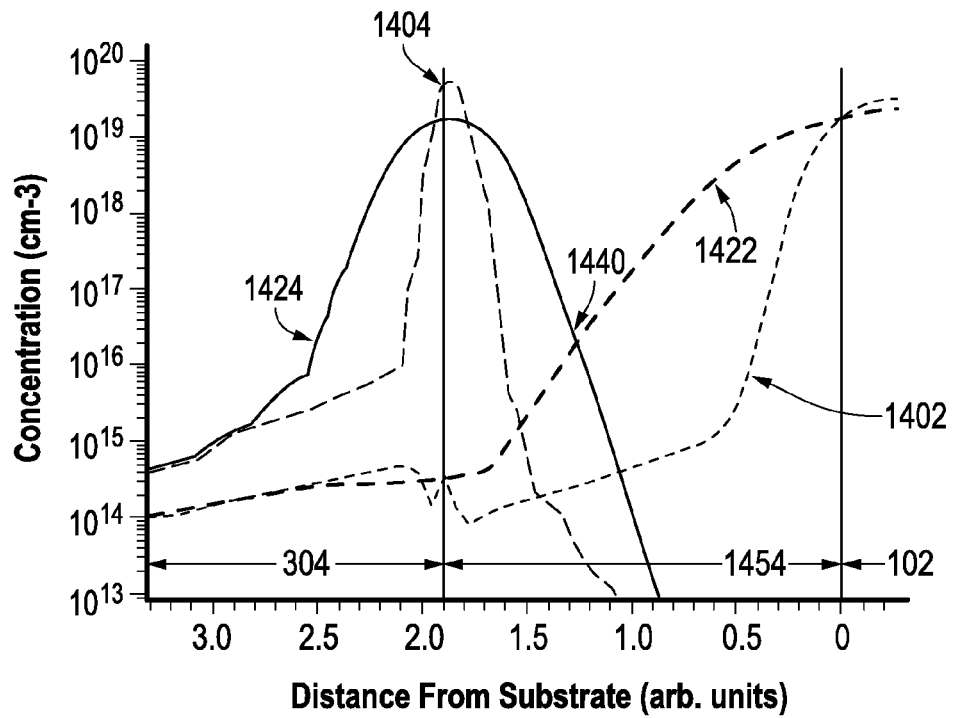
FIG. 14 includes a plot of doping concentration profiles at different times in the process flow for a comparative electronic device.

The benefits of embodiments in accordance with embodiments are understood more clearly with dopant concentration profiles as illustrated in FIGS. 13 and 14 that illustrate the dopant concentration profiles after forming the semiconductor layer 304 and in the finished electronic device. The dopant concentration profiles for the finished devices do not include the doped regions 504 and 506 that are formed at the primary surface of the semiconductor layer 304. The x-axis has the distance from the substrate 102 (in arbitrary units).

In FIG. 13, the dopant concentration profile 1302 corresponds to the dopant concentration of dopant of the same conductivity type as the substrate 102 (e.g., p-type dopant) after forming the semiconductor layer 304. The semiconductor layer 104 is formed with the lower doped portion 1042 having a constant dopant concentration of $1 \times 10^{17}$ atoms/cm$^3$ and the upper portion 1044 is undoped. During formation of the semiconductor layer 104, some of the dopant from the substrate 102 diffuses into the lower portion 1042 of the semiconductor layer 104, and during formation of the semiconductor layer 304, some of the dopant from the lower portion 1042 of the semiconductor layer diffuses into the upper portion 1044 and the semiconductor layer 304. The dopant concentration profile 1304 corresponds to the dopant concentration of dopant of the opposite conductivity type as the substrate 102. In an embodiment, the dopant concentration profile 1304 is for an n-type dopant. The dopant concentration profile 1304 corresponds to the doped region 204.

The dopant concentration profile 1322 corresponds to the dopant concentration of dopant of the same conductivity type as the substrate 102 (e.g., p-type dopant) in the finished device. Dopant from both the substrate 102 and the lower portion 1042 of the semiconductor layer continue to diffuse, and thus, the dopant concentration profile 1322 makes more gradual transitions between and within the semiconductor layers 104 and 304 as compared to the dopant concentration profile 1302. The dopant concentration profile has a relatively steeper portion as illustrated by line 1361, a relatively flatter portion as illustrated by line 1362, and another relatively steeper portion as illustrated by line 1363. Throughout the dopant concentration profile 1322, the dopant concentration decreases as the distance from the substrate 102 increases, including within the relatively flatter portion. The dopant concentration profile 1324 corresponds to the dopant concentration of dopant of the opposite conductivity type as the substrate 102. In an embodiment, the dopant concentration profile 1324 is for an n-type dopant. The doped region 204 is significantly wider in the finished device as compared to the doped region 204 immediately after forming the semiconductor layer 304. A pn junction for the zener diode is formed at the depth corresponding to location 1340.

FIG. 14 corresponds to a comparative device that does not use the concepts as described herein. In FIG. 14, the dopant concentration profile 1402 corresponds to the dopant concentration of dopant of the same conductivity type as the substrate 102 (e.g., p-type dopant) after forming semiconductor layers 1454 (instead of the semiconductor layer 104) and 304 (as previously described). Each of the semiconductor layers 1454 and 304 are undoped as formed. During formation of the semiconductor layers 1454 and 304, some of the dopant from the substrate 102 diffuses into the semiconductor layers 1454 and 304. The dopant concentration profile 1404 corresponds to the dopant concentration of dopant of the opposite conductivity type as the substrate 102. In an embodiment, the dopant concentration profile 1404 is for an n-type dopant. The dopant concentration profile 1404 corresponds to a doped region similar to the doped region 204.

The dopant concentration profile 1422 corresponds to the dopant concentration of dopant of the same conductivity type as the substrate 102 (e.g., p-type dopant) in the finished device. Dopant from both the substrate 102 continues to diffuse, and thus, the dopant concentration profile 1422 has a single steep portion, and thus, does not have a relatively flatter portions as seen with the dopant concentration profile in FIG. 13. The dopant concentration profile 1424 corresponds to the dopant concentration of dopant of the opposite conductivity type as the substrate 102. In an embodiment, the dopant concentration profile 1424 is for an n-type dopant. The doped region (similar to the doped region 204) is significantly wider in the finished device as compared to immediately after forming the semiconductor layer 304. A pn junction for the zener diode is formed at the depth corresponding to location 1440.

The relatively flatter portion of the dopant concentration profile 1322 can provide significantly less variation in breakdown voltage due to process variations. The dopant concentration of the substrate 102, the thickness of the semiconductor layer 104, and the product of diffusion coefficients (functions of temperatures of processing operations) times time at various processing temperatures can affect the breakdown voltage of the zener diode. Better control over the breakdown voltage can be achieved because the pn junction within the semiconductor layer 104 occurs at a relatively flatter portion of the dopant concentration profile.

The lower variation in breakdown voltage allows an EDS device to have a zener diode with a breakdown voltage closer to a triggering voltage of a component, such as a transistor, that the ESD device is to protect. For example, if the minimum triggering voltage is to be 20 V, the comparative device cannot be used because a zener diode made during one production run can have a breakdown voltage as low as 18 V. Furthermore, another comparative device may be formed during a different production run and have a breakdown voltage as high as 29 V. For the comparative device, the zener diode can be designed for a higher average breakdown voltage, so that the breakdown voltage on the low end is at least 20 V; however, zener diodes made during different production runs will have a higher variation in breakdown voltage, and the breakdown voltage on the high end can be 35 V, and possibly higher. In some applications, such a high breakdown voltage may not adequately protect sensitive components within the electronic device.

Unlike the comparative device, the electronic device having a zener diode formed using the concepts as described herein, much less variability in the breakdown voltage will occur from production run-to-production run. Thus, a zener diode corresponding to the concentration doping profile 1542 can be used and have a breakdown voltage consistently within a range of 20 V to 25 V when produced in different production runs, even if the individual process steps in forming the devices are operate at the edges of the production specifications. Thus, the electronic device can be designed with a lower average triggering voltage while still adequately protecting sensitive component even when the process in forming the electronic device is not well controlled.

Another benefit with particular embodiments as described herein is that no doping or lower dopant concentration in the upper portion 1044 of the semiconductor layer 104 reduces the likelihood that too much dopant from the semiconductor layer 104 or the substrate 102 would diffuse into the semiconductor layer 304. In a particular embodiment, if the p-type dopant concentration within the semiconductor layer 304 is too high close to the doped region 204, another zener diode, rather than a P-N diode would be formed. Referring to FIG. 7, the P-N diode 14 would be replaced by a zener diode, and operation of the ESD device would no longer work as designed.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Embodiment 1. An electronic device comprising:
 a substrate having a first dopant with a first conductivity type;
 a first semiconductor layer over the substrate and including a second dopant of the first conductivity type;
 a second semiconductor layer over the first semiconductor layer; and
 a first doped region at an interface of and extending into the first and second semiconductor layers, wherein the first doped region has a third dopant with a second conductivity type opposite the first conductivity type, wherein:
  a first dopant concentration profile of the first dopant has a first relatively steeper portion adjacent to the substrate, a second relatively steeper portion adjacent to an interface between the first and second semiconductor layers, and a relatively flatter portion between the first and second relative steeper portions; and
  a first diode is formed at a pn junction where a second dopant concentration profile of the first doped region intersects the relatively flatter portion of the first dopant concentration profile.

Embodiment 2. The electronic device of Embodiment 1, wherein the second dopant concentration profile of the first doped region intersects the relatively flatter portion of the first dopant concentration profile within the first semiconductor layer.

Embodiment 3. The electronic device of Embodiment 1, wherein a concentration of the first dopant decreases as a function of distance throughout all of the relatively flatter portion of the first dopant concentration profile.

Embodiment 4. The electronic device of Embodiment 1, wherein each of the first and second dopants is boron.

Embodiment 5. The electronic device of Embodiment 4, wherein the third dopant is arsenic or antimony.

Embodiment 6. The electronic device of Embodiment 1, further comprising:
 a second doped region having the first conductivity type, wherein:
  the second doped region is within the second semiconductor layer at a surface opposite the first semiconductor region and overlies the first doped region; and
  a second diode is formed at a pn junction between the second doped region and the first doped region.

Embodiment 7. The electronic device of Embodiment 6, further comprising:
 a third doped region having the second conductivity type, wherein:
  the third doped region is within the second semiconductor layer at the surface opposite the first semiconductor region and at least a portion of the third doped region does not overlie the first doped region; and
  a third diode is formed at a pn junction between the third doped region and the substrate.

Embodiment 8. The electronic device of Embodiment 7, further comprising an isolation pillar extending through the second semiconductor layer to an elevation lower than the pn junction of the first diode, wherein the isolation pillar is disposed between the second and third doped regions.

Embodiment 9. The electronic device of Embodiment 1, wherein the first doped region electrically floats.

Embodiment 10. The electronic device of Embodiment 1, further comprising a conductive region extending from a surface of the second semiconductor layer to the first doped region, wherein the conductive region has the second conductivity type.

Embodiment 11. The electronic device of Embodiment 10, comprising an electrostatic discharge device that comprises the first diode, the second diode, and the third diode.

Embodiment 12. The electronic device of Embodiment 11, wherein:
 each of the first, second, and third diodes have an anode and a cathode;
 the anode of the first diode and the anode of the third diode are coupled to each other;
 the cathode of the first diode and the cathode of the second diode are coupled to each other; and
 the anode of the second diode and the cathode of the third diode are coupled to each other.

Embodiment 13. A process of forming an electronic device comprising:
 providing a first semiconductor layer over a substrate, wherein:
  the substrate includes a first dopant of a first conductivity type at a first dopant concentration;
  the first semiconductor layer includes a first portion closer to the substrate and a second portion further from the substrate;
  the first portion includes a second dopant of the first conductivity type at a second dopant concentration that is lower than the first dopant concentration; and
  the second portion has no dopant or includes a third dopant of the first conductivity type at a third dopant concentration that is lower than the second dopant concentration;
 forming a first doped region within the first semiconductor layer, wherein the first doped region has a second conductivity type opposite that of the first conductivity type; and
 forming a second semiconductor layer over the first doped region,
 wherein in a finished electronic device, a first diode is formed at a pn junction between the first doped region and the substrate.

Embodiment 14. The process of Embodiment 13, wherein providing a first semiconductor layer over the substrate comprises:
 forming of the first portion of the first semiconductor layer, such that the first portion is formed with the second dopant at the second dopant concentration; and forming the second portion of the first semiconductor layer, such that the second portion is formed with no dopant or with the third dopant of at the third dopant concentration.

Embodiment 15. The process of Embodiment 14, wherein during formation of the first portion of the first semiconductor layer, the second dopant flows at relatively constant rate into a reaction chamber where the first portion is being formed.

Embodiment 16. The process of Embodiment 15, wherein during formation of the second portion of the first semiconductor layer, no dopant flows into the reaction chamber where the second portion is being formed.

Embodiment 17. The process of Embodiment 14, wherein:
  forming the first semiconductor layer comprises epitaxially growing the first semiconductor layer; and
  forming the second semiconductor layer comprises epitaxially growing the second semiconductor layer.

Embodiment 18. The process of Embodiment 13, wherein the first portion is 50% to 90% of a total thickness of the first semiconductor layer.

Embodiment 19. The process of Embodiment 13, further comprising completing formation of the electronic device, wherein after forming the first semiconductor layer through completing formation, first dopant from the substrate, second dopant from the first portion of the semiconductor layer, or both diffuse into the second semiconductor layer, and a total dopant concentration corresponding to the first and second dopants within the second semiconductor layer is lower than a concentration of the first doped region at all points within the second semiconductor layer.

Embodiment 20. The process of Embodiment 13, further comprising forming a second doped region having the first conductivity type within the second semiconductor layer at a surface opposite the first semiconductor region and over the first doped region, wherein a second diode is formed at a pn junction between the second doped region and the first doped region.

Embodiment 21. The process of Embodiment 13, further comprising forming a third doped region having the second conductivity type within the second semiconductor layer at the surface opposite the first semiconductor region and at least a portion of the third doped region does not overlie the first doped region wherein a third diode is formed at a pn junction between the third doped region and the substrate.

Embodiment 22. The process of Embodiment 13, further comprising:
  forming a second diode within the second semiconductor layer;
  forming a third diode within the second semiconductor layer and space apart from the second diode.

Embodiment 23. The process of Embodiment 22, wherein:
  each of the first, second, and third diodes have an anode and a cathode; and
  in a finished device:
    the anode of the first diode and the anode of the third diode are coupled to each other;
    the cathode of the first diode and the cathode of the second diode are coupled to each other; and
    the anode of the second diode and the cathode of the third diode are coupled to each other.

Embodiment 24. The process of Embodiment 23, wherein the electronic device comprises an electrostatic discharge device that includes the first, second, and third diodes.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:
1. An electronic device comprising:
  a substrate having a first dopant with a first conductivity type;
  a first semiconductor layer over the substrate and including a second dopant of the first conductivity type;
  a second semiconductor layer over the first semiconductor layer; and
  a first doped region at an interface of and extending into the first and second semiconductor layers, wherein the first doped region has a third dopant with a second conductivity type opposite the first conductivity type,
  wherein:
    a first dopant concentration profile of the first and second dopants has a first relatively steeper portion adjacent to the substrate, a second relatively steeper portion adjacent to an interface between the first and second semiconductor layers, and a relatively flatter portion between the first and second relative steeper portions; and
    a first diode is formed at a pn junction where a second dopant concentration profile of the third dopant intersects the relatively flatter portion of the first dopant concentration profile.

2. The electronic device of claim 1, wherein the second dopant concentration profile of the first doped region intersects the relatively flatter portion of the first dopant concentration profile within the first semiconductor layer.

3. The electronic device of claim 1, wherein a concentration of the first dopant decreases as a function of distance throughout all of the relatively flatter portion of the first dopant concentration profile.

4. The electronic device of claim 1, wherein each of the first and second dopants is boron.

5. The electronic device of claim 4, wherein the third dopant is arsenic or antimony.

6. The electronic device of claim 1, wherein:
the first semiconductor layer includes a lower portion closer to the substrate and an upper portion further from the substrate; and
the lower portion has a higher dopant concentration as compared to the upper portion.

7. The electronic device of claim 6, wherein, as formed, the lower portion includes a section of constant dopant concentration, and the upper portion is undoped.

8. The electronic device of claim 6, wherein the relatively flatter portion of the first dopant concentration profile extends into the lower and upper portions of the first semiconductor layer.

9. The electronic device of claim 1, further comprising:
a second doped region having the first conductivity type, wherein:
the second doped region is within the second semiconductor layer at a surface opposite the first semiconductor layer and overlies the first doped region; and
a second diode is formed at a pn junction that includes the second doped region.

10. The electronic device of claim 9, further comprising:
a third doped region having the second conductivity type, wherein:
the third doped region is within the second semiconductor layer at the surface opposite the first semiconductor layer and at least a portion of the third doped region does not overlie the first doped region; and
a third diode is formed at a pn junction that includes the third doped region.

11. The electronic device of claim 10, wherein none of the third doped region is superimposed over the first doped region.

12. The electronic device of claim 10, further comprising an isolation pillar extending through the second semiconductor layer to an elevation lower than the pn junction of the first diode, wherein the isolation pillar is disposed between the second and third doped regions.

13. The electronic device of claim 10, wherein the first diode is a zener diode, and the second and third diodes are pn junction diodes and are not zener diodes.

14. The electronic device of claim 10, comprising an electrostatic discharge device that comprises the first diode, the second diode, and the third diode.

15. The electronic device of claim 14, wherein:
each of the first, second, and third diodes have an anode and a cathode;
the anode of the first diode and the anode of the third diode are coupled to each other;
the cathode of the first diode and the cathode of the second diode are coupled to each other; and
the anode of the second diode and the cathode of the third diode are coupled to each other.

16. An electronic device comprising:
a substrate having a first dopant with a first conductivity type;
a first semiconductor layer over the substrate and including a second dopant of the first conductivity type;
a second semiconductor layer over the first semiconductor layer and having a primary surface opposite the first semiconductor layer; and
a buried doped region at an interface of and extending into the first and second semiconductor layers, wherein the buried doped region has a third dopant with a second conductivity type opposite the first conductivity type,
a first surface doped region having the first conductivity type, wherein the first surface doped region is within the second semiconductor layer at the primary surface and at least a portion of the first surface doped region does not overlie the buried doped region; and
wherein:
a first dopant concentration profile of the first and second dopants has a first relatively steeper portion adjacent to the substrate, a second relatively steeper portion adjacent to an interface between the first and second semiconductor layers, and a relatively flatter portion between the first and second relative steeper portions;
a first diode is formed at a pn junction where a second dopant concentration profile of the third dopant intersects the relatively flatter portion of the first dopant concentration profile; and
a second diode is formed at a pn junction that includes the third doped region.

17. The electronic device of claim 16, further comprising:
a second surface doped region having the second conductivity type, wherein:
the second surface doped region is within the second semiconductor layer at the primary surface and overlies the buried doped region; and
a third diode is formed at a pn junction that includes the second surface doped region.

18. The electronic device of claim 17, further comprising a first conductive region that extends from the buried doped region to the primary surface, wherein the second conductive region encloses a portion of the second semiconductor layer that includes the second surface doped region.

19. The electronic device of claim 18, further comprising:
a first conductive region within the second semiconductor layer and extending from the buried doped region toward the primary surface; and
an interconnect that overlies and is electrically connected to the first conductive region and the buried doped region.

20. The electronic device of claim 17, further comprising a fourth diode and a fifth diode, wherein:
anodes of the first, second, and fourth diodes are electrically connected to one another;
cathodes of the first, third, and fifth diodes are electrically connected to one another;
a cathode of the second diode is electrically connected to an anode of the third diode; and
a cathode of the fourth diode is electrically connected to an anode of the fifth diode.

* * * * *